United States Patent
Deppisch

(10) Patent No.: US 10,066,291 B2
(45) Date of Patent: Sep. 4, 2018

(54) APPARATUS AND METHOD FOR THIN-FILM PROCESSING APPLICATIONS

(71) Applicant: Applied Materials, Inc., Santa Clara, CA (US)

(72) Inventor: Thomas Deppisch, Ascheffenburg (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/118,810

(22) PCT Filed: Feb. 21, 2014

(86) PCT No.: PCT/EP2014/053460
§ 371 (c)(1),
(2) Date: Aug. 12, 2016

(87) PCT Pub. No.: WO2015/124207
PCT Pub. Date: Aug. 27, 2015

(65) Prior Publication Data
US 2017/0067149 A1    Mar. 9, 2017

(51) Int. Cl.
*C23C 14/58* (2006.01)
*C23C 14/56* (2006.01)
(Continued)

(52) U.S. Cl.
CPC .......... *C23C 14/5873* (2013.01); *C23C 14/24* (2013.01); *C23C 14/562* (2013.01); *C23C 16/50* (2013.01); *C23C 16/56* (2013.01); *H01J 37/32082* (2013.01); *H01J 2237/335* (2013.01); *H01J 2237/3321* (2013.01)

(58) Field of Classification Search
None
See application file for complete search history.

(56) References Cited

U.S. PATENT DOCUMENTS

2001/0055647 A1 * 12/2001 Tamura ................ C23C 14/562
427/177
2005/0145326 A1 * 7/2005 Hatwar ............... H01L 51/0013
156/230

(Continued)

FOREIGN PATENT DOCUMENTS

EP    2508646 A1    10/2012
JP    2011127188 A    6/2011

OTHER PUBLICATIONS

International Search Report and Written Opinion dated Apr. 16, 2014 for Application No. PCT/EP2014/053460.

*Primary Examiner* — Joseph A Miller, Jr.
(74) *Attorney, Agent, or Firm* — Patterson + Sheridan, LLP

(57) ABSTRACT

According to the present disclosure, a flexible substrate coating apparatus is provided. The flexible substrate coating apparatus includes a vacuum process chamber for processing a flexible substrate. The vacuum process chamber includes one or more deposition units and a cleaning unit positioned directly downstream of the one or more deposition units. In another aspect, a method for depositing a thin-film on a flexible substrate is provided. The method for depositing a thin-film on a flexible substrate includes vacuum coating of the flexible substrate, thereby depositing one or more layers on the flexible substrate, and cleaning the flexible substrate directly downstream of the coating.

14 Claims, 6 Drawing Sheets

(51) Int. Cl.
*C23C 14/24* (2006.01)
*C23C 16/50* (2006.01)
*C23C 16/56* (2006.01)
*H01J 37/32* (2006.01)

(56) References Cited

U.S. PATENT DOCUMENTS

2009/0252893 A1* 10/2009 Ozaki ............... C23C 16/45595
  427/579
2009/0324823 A1* 12/2009 Hirono .................. C23C 14/562
  427/255.5

* cited by examiner

APPARATUS AND METHOD FOR THIN-FILM PROCESSING APPLICATIONS

TECHNICAL FIELD OF THE INVENTION

Embodiments of the present invention relate to thin-film deposition apparatuses, particularly to apparatuses and methods including cleaning of the thin-film, and more particularly to apparatuses and methods of roll-to-roll (R2R) systems including cleaning of the thin-film. Embodiments of the present invention particularly relate to apparatuses and methods for plasma cleaning processing chambers of R2R chemical vapor deposition (CVD) systems.

BACKGROUND OF THE INVENTION

Processing of flexible substrates, such as plastic films or foils, is in high demand in the packaging industry, semiconductor industries and other industries. Processing may consist of coating of a flexible substrate with a desired material, such as a metal, semiconductors and dielectric materials, etching and other processing steps conducted on a substrate for the desired applications. Systems performing this task generally include a processing drum, e.g., a cylindrical roller, coupled to a processing system for transporting the substrate, and on which at least a portion of the substrate is processed. Roll-to-roll coating systems can, thereby, provide a high throughput system.

Typically, a coating process, such as a chemical evaporation process or a thermal evaporation process, can be utilized for depositing thin layers of materials onto flexible substrates. Roll-to-roll deposition systems are understood in that a flexible substrate of considerable length, such as at least several kilometers, is uncoiled from a flexible substrate storage spool, coated with a thin-film, and recoiled again on another spool. Roll-to-roll deposition systems are also experiencing a strong increase in demand in the display industry and the photovoltaic (PV) industry. For example, touch panel elements, flexible displays, and flexible PV modules result in an increasing demand for depositing suitable layers in Roll-to-Roll coaters, particularly with low manufacturing costs.

Damages to the substrate may reduce the usability and/or value of the substrate. In particular, particles may be located on the flexible substrate and may thus pollute the substrate's surface. Even worse, if the flexible substrate is wound up after the deposition, the dirt particles may be included in between the layers of the flexible substrate on the spool. They may not only cause a pinhole or the like at their position, they may also cause damages to adjacent layers which are pressed against the particles in the winding process.

Therefore, there is a need in the art for an efficient cleaning apparatus and method when processing flexible substrates, such as OLED structures, semiconductor structures and other modern more sophisticated devices to ensure substrate deposition quality is enhanced.

SUMMARY OF THE INVENTION

In light of the above, an apparatus for processing flexible substrates and a method for processing flexible substrates is provided. Further aspects, advantages, and features of the present invention are apparent from the dependent claims, the description, and the accompanying drawings.

In one aspect, a flexible substrate coating apparatus is provided. The flexible substrate coating apparatus includes a vacuum process chamber for processing a flexible substrate. The vacuum process chamber includes one or more deposition units and a cleaning unit positioned directly downstream of the one or more deposition units.

In another aspect, a method for depositing a thin-film on a flexible substrate is provided. The method for depositing a thin-film on a flexible substrate includes vacuum coating of the flexible substrate, thereby depositing one or more layers on the flexible substrate, and cleaning the flexible substrate directly downstream of the coating.

The disclosure is also directed to an apparatus for carrying out the disclosed methods and including apparatus parts for performing each described method steps. These method steps may be performed by way of hardware components, a computer programmed by appropriate software, by any combination of the two or in any other manner. Furthermore, the disclosure is also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

It is noted that a flexible substrate as used within the embodiments described herein is typically bendable. The term "web" may be synonymously used with the term "foil" or the term "flexible substrate".

Embodiments described herein, generally relate to apparatuses and methods for coating a flexible substrate, thereby reducing the occurrence of contamination and damages. In particular, embodiments described herein include cleaning the flexible substrate, e.g. by a cleaning unit. In particular, embodiments described herein include the activity of cleaning and the cleaning unit positioned in the vacuum process chamber.

Figure 1:
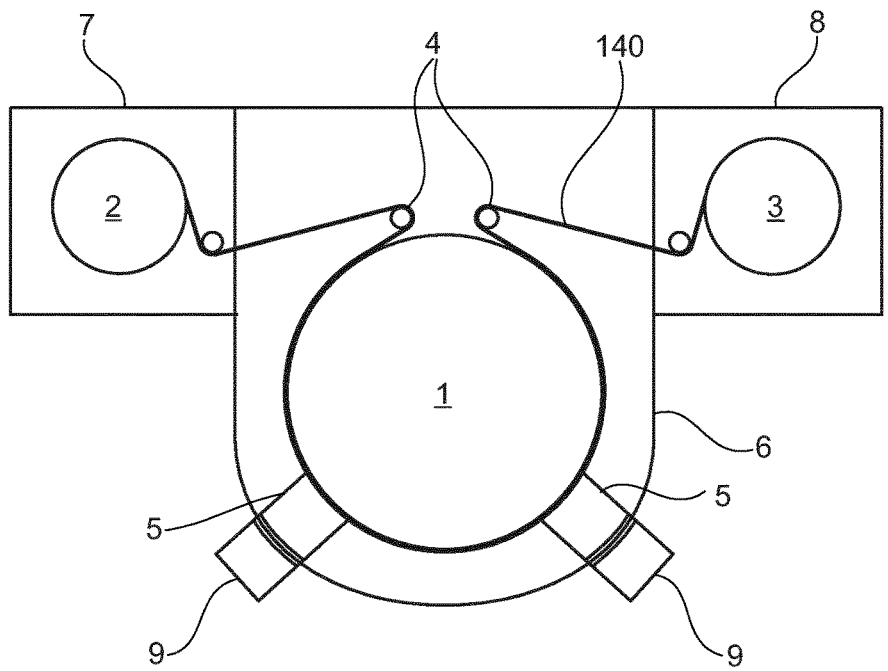
FIGS. 1, 2 and 3 show schematic views of a flexible substrate coating apparatus as known.

FIG. 1 illustratively shows a flexible substrate coating apparatus as known to the inventor. A flexible substrate 140 is provided on a storage spool 2. In operation of the flexible substrate coating apparatus, it is guided via one or more deflection rolls, such as roll 4, to the coating drum 1. In the example shown, two deposition units 5 are illustrated which deposit one or more layers on the flexible substrate. After deposition, the flexible substrate is guided to a wind up spool 3.

Typically, during the deposition, the vacuum process chamber 6, i.e. the chamber where the deposition takes place, is under medium vacuum (i.e., between $3 \times 10^1$ to $1 \times 10^{-3}$ mbar), such as in the case of chemical vapour deposition (CVD) or sputtering, or high vacuum (that is, typically below $10^{-3}$ mbar), such as in the case of evaporation. The so-called background vacuum, i.e. the pressure to which the vacuum process chamber is pumped down before the deposition process starts, is typically in the range of between $10^{-5}$ mbar and $10^{-6}$ mbar. The spool chambers 7 and 8 may be under pressure of about $10^{-1}$ and $10^{-3}$ mbar. As shown, a control and/or power provision unit 9 for the deposition units may also be provided.

In practice, it turned out in quality controls that particles may gather on the flexible substrate, leading to dirt and damages on the substrate's surface. Those issues are also called "winding defects". In more detail, such a defect is normally a small area in the order of magnitude of 10 microns where the deposited film or even the complete flexible substrate is locally abraded. Possible sources for these defects are, for instance, particles that are located on the flexible substrate of the storage spool, and also particles that are caused by the coating process and adhere to the substrate.

Insofar as known to the inventor, several approaches were made in the attempt to avoid the problem of winding defects. One approach is a system where the flexible substrate runs on the back side only for the whole deposition process until winding up the flexible substrate. However, such a design is not suitable for all kinds of required processes. In particular, it may not be suitable for thin film deposition which makes use of spreader rollers and tension separation (i.e., where the substrate tension during deposition is higher than desired for the winding of the flexible substrate).

Figure 2:
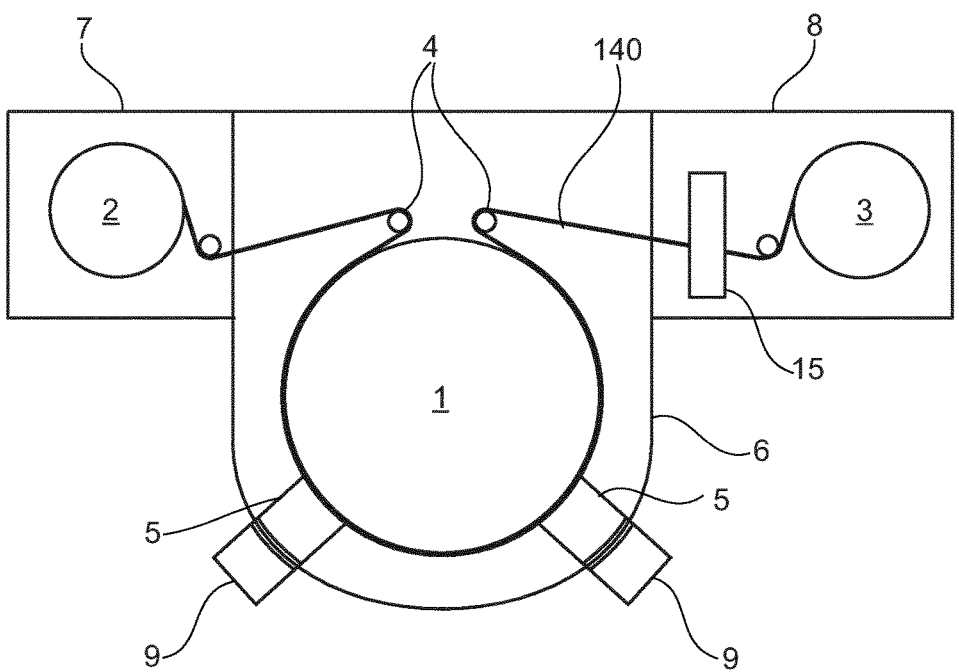

Therefore, it was proposed to arrange a cleaning unit before winding the flexible substrate. This is shown in FIG. 2 where a cleaning unit 15 is provided in the spool chamber 8 to clean the flexible substrate. The purpose of the cleaning unit was to collect particles on the flexible substrate before the substrate was wound up on the spool 3. It was considered that the problem of winding defects would be overcome by this provision of the cleaning unit.

Figure 3:
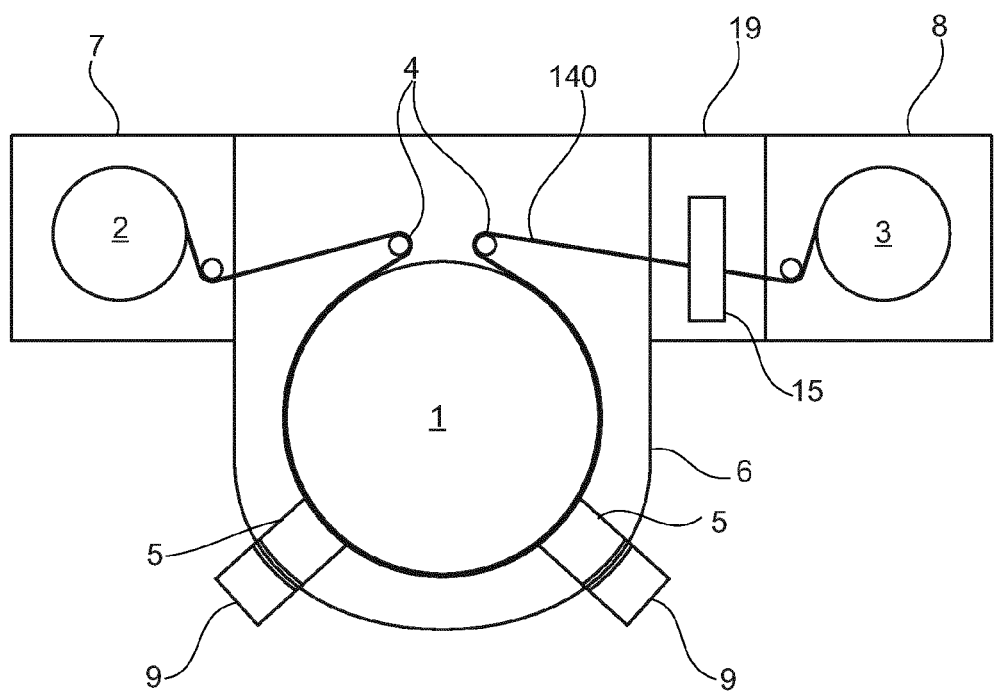

In an alternative example, as illustrated in FIG. 3, the cleaning unit 15 was placed in an intermediate chamber 19 located between the vacuum process chamber 6 and the spool chamber 8, mainly for space reasons.

However, the inventor of the present disclosure found out in various analyses that, whereas the occurrence of dirt on the surface of the flexible substrate could be essentially reduced by the provision of the cleaning unit as shown in FIGS. 2 and 3, there were still major local damages to the flexible substrate. In particular, there were pinholes in the flexible substrate.

Figure 4:
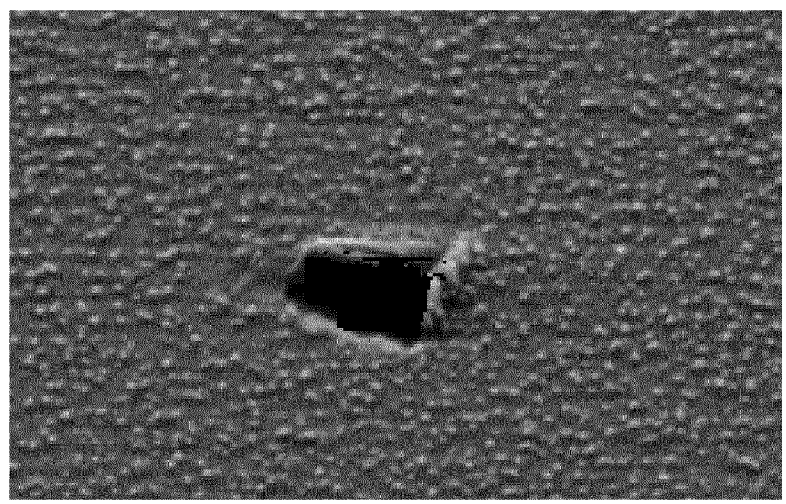
FIG. 4 shows an enlarged exemplary view of a pinhole on a flexible substrate.

An example of such a pinhole is illustrated in FIG. 4. Those pinholes are comparably large and can be in the order of magnitude of the structures to be coated, such as a metal mesh or a TFT structure. Evidently, with such a pinhole, the function of the structure is locally destroyed.

Interestingly, where such pinholes in the flexible substrate regularly propagated to adjacent layers when they were coated in a deposition apparatus without any cleaning unit (such as with a deposition apparatus as illustrated in FIG. 1), it turned out that many of the pinholes did not propagate to adjacent layers when they were coated in a deposition apparatus including the cleaning unit as illustrated in FIG. 2 or 3.

The inventor of the present disclosure thus proposes a flexible substrate coating apparatus according to the independent claims, and furthermore illustrated in some exemplary embodiments in the following. In analyses the inventor could find out that the occurrence of pinholes in the flexible substrate could essentially be reduced.

In more detail, according to the present disclosure, a cleaning unit is provided directly downstream of the coating unit. The term "directly downstream" can be understood as follows. According to a possible definition, there is no roll or pulley, such as a deflection roll, that comes into contact with the coated side of the flexible substrate between coating unit and cleaning unit. Hence, the coated side of the flexible substrate is not touched by anything else before it is cleaned in the cleaning unit.

For completeness it shall be noted that typically only the contact under pressure results in the previously described pinholes. Therefore, the contact with a roll that does not exert pressure on the flexible structure may not be harming. Thus, one may define the term "directly downstream" in that there is no roll or pulley, such as a deflection roll, positioned between the coating unit and the cleaning unit that exerts a force on the flexible substrate of more than 20N per meter width of the flexible substrate. Since in many applications the pressure is also related to the enlacement angle of the flexible substrate around a deflection roll or the like, a suitable definition may also be phrased in that there is no roll or pulley, such as a deflection roll, between the coating unit and the cleaning unit, on which the flexible substrate's enlacement angle is more than 5° or even more than 10°.

For the method as described herein the term "directly downstream" typically implies that the flexible substrate is cleaned directly after coating without guiding the substrate to a deflection roll or pulley that could exert a pressure on it, as explained previously.

Figure 5:
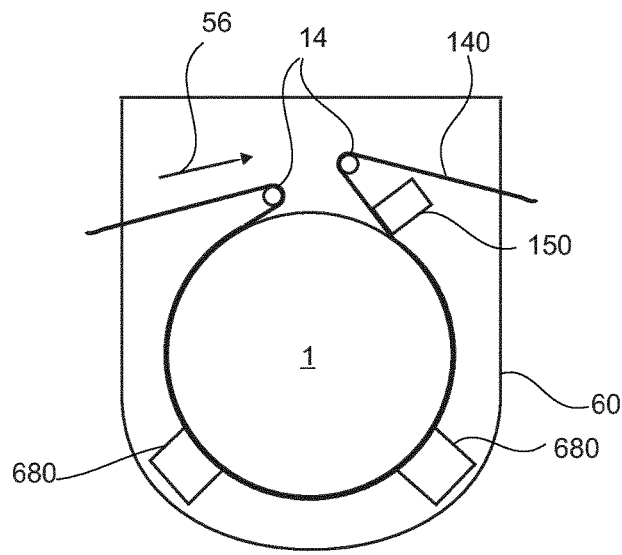
FIGS. 5, 6, 7 and 8 show schematic views of a flexible substrate coating apparatus according to embodiments described herein.

An embodiment of the flexible substrate coating apparatus 100 is illustrated in FIG. 5. Therein, the vacuum process chamber 60 is shown which is typically held at medium or high vacuum during coating. The flexible substrate 140 is guided as shown by the arrow 56 to the coating drum 1, and undergoes one or more coating processes by the deposition units 680. After deposition, and before contacting any deflection roll 14, the flexible substrate 140 is cleaned by the cleaning unit 150. The cleaning unit 150 is positioned directly downstream of the one or more deposition units. Not limited to any embodiment, the cleaning unit is typically configured to clean the coated side of the flexible substrate.

A further exemplary embodiment shall be discussed with reference to the illustration of FIG. 6. This figure illustratively represents various possible embodiments of a flexible substrate coating apparatus 100. The terms "coating" and "deposition" are used synonymously herein.

Figure 6:
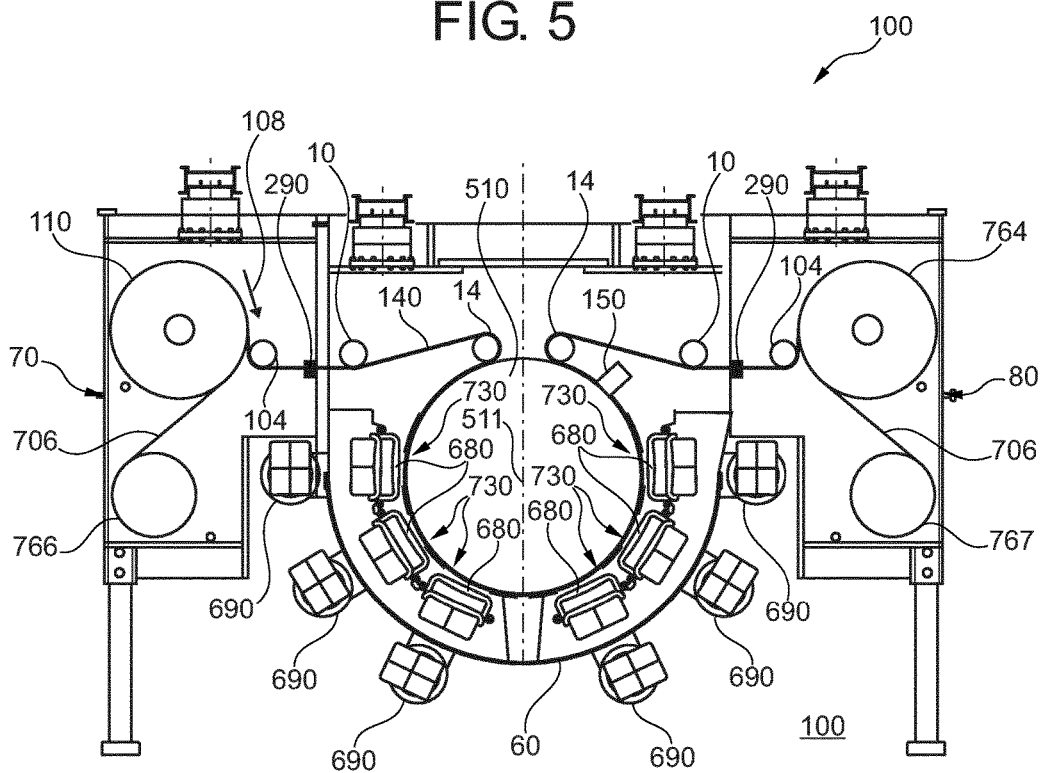

Not limited to this embodiment, the flexible substrate coating apparatus may generally be configured to house the substrate storage spool, as it is illustrated in the embodiment of FIG. 6 and denoted by reference number 110. According to some embodiments, which can be combined with other embodiments described herein, the flexible substrate 140 to be processed can be provided on the storage spool 110. The storage spool is typically placed in a separate spool chamber 70. It is also possible that an interleaf 706 is provided between the adjacent layers of the flexible substrate such that direct contact of one layer of the flexible substrate with an adjacent layer of the flexible substrate on the storage spool 110 can be omitted.

In operation, the flexible substrate 140 is unwound from the storage spool 110 as indicated by the substrate movement direction shown by arrow 108. Upon unwinding of the flexible substrate 140 from the storage spool 110, if present, the interleaf 706 may be wound on the interleaf roll 766.

The flexible substrate 140 may be guided via one or more guide rollers 104. It is also possible that the flexible substrate 140 is guided by one or more substrate guide control units 10 that shall control the proper run of the flexible substrate, for instance, by fine adjusting the orientation of the flexible substrate.

In the vacuum process chamber, a coating drum 510 is typically provided. After uncoiling from the flexible substrate storage spool 110 and running over the roller 104 and the flexible substrate guide control unit 10, the flexible substrate 140 is then moved through the deposition areas 730 provided at the coating drum 510 and corresponding to positions of the deposition units 680. During operation, the coating drum 510 rotates around axis 511 such that the flexible substrate moves in the direction of arrow 108.

Directly after the deposition by the deposition units 680, the flexible substrate is cleaned by the cleaning unit 150. Thereby, and not limited to any embodiment, the cleaning unit 150 is typically positioned in the vacuum process chamber 60.

In particular, and not limited to the present embodiment, the cleaning unit may be positioned such that it acts on the flexible substrate when the flexible substrate is still positioned on the drum. Cleaning can thus be a process step that is performed in a process section of the coating drum. This is particularly beneficial as it allows a defined contact pressure of the cleaning unit against the flexible substrate.

Alternatively, it is also possible that the cleaning unit is positioned in the free span of the flexible substrate between the coating drum and the next guide roller. In such a case it is also possible that two cleaning units are provided wherein each one cleaning unit is positioned on each side of the flexible substrate.

In the illustration of FIG. 6, the flexible substrate 140 is cleaned by the cleaning unit 150 directly after running through the last deposition process and still on the coating drum. In addition, the flexible substrate 140 is cleaned before it comes into contact with the deflection roll 14. In other words, and pertinent for all embodiments described herein, the design of the flexible substrate coating apparatus is such that the first element in the flexible substrate coating apparatus that touches the coated side of the flexible substrate downstream of the deposition process is the cleaning unit, and nothing else.

The reason for this is that the inventor found out that the substrate damages as described previously can be essentially reduced or even avoided if there is no dirt on the substrate's surface when the substrate is contacted by a deflection roller. Where the dirt on the substrate is undesired already, it turns out that the contact with the deflection roller, such as the deflection roller 4 in the deposition apparatuses of FIGS. 1 and 2, will press the dirt into the substrate. This may carve the footprint of the particle into the substrate leading to pinholes or the like.

Providing a cleaning unit directly downwards one or more of the deposition units and typically still in the vacuum process chamber has not been considered in the art so far for another reason. The vacuum process chamber is typically under high vacuum for optimizing the deposition quality and avoiding foreign particles to be enclosed in the deposited layer. Furthermore, the process chemistry of the deposition process can be very delicate with all other sources of particles having unknown or even negative effect thereon. In particular, deposition apparatuses with e.g. CVD, PECVD and/or PVD sources, use different residues from gas mixtures. Contamination with unknown or undesired evaporation from a cleaning unit could thus jeopardize the long term stability of the deposition process. It was thus a clear understanding in the prior art to avoid any kind of additional equipment in the vacuum process chamber. It is the inventor's believe that therefore no one ever considered putting a cleaning unit into the processing chamber.

However, in analyses of the present disclosure it turned out that not only the occurrence of pinholes and other damage to the substrate could be reduced but also the negative effect of the cleaning unit in the processing chamber is hardly or not at all recognizable. In other words, although cleaning units such as adhesive rolls (see detailed description below) were considered to be dirt swirls in the vacuum process chamber with their surfaces evaporating all kind of undesired molecules, analysis shows that the impact thereof was misjudged and they do surprisingly not have a negative influence on the deposition process, its stability and the deposition quality.

With reference again to FIG. 6, after being cleaned by the cleaning unit 150, the flexible substrate 140 may run over one or more deflection rolls 14. As the deposited surface has been cleaned by the cleaning unit before, this does not lead to particles being caved into the substrate. The one or more deflection rolls downstream of the coating unit and the cleaning unit may also serve as tensioning units that allow the substrate to have a different tension during the deposition than during winding of the flexible substrate.

Furthermore, the flexible substrate may run over one or more flexible substrate guide control units 10 and further rolls, such as roll 104 depicted in FIG. 6. As the flexible substrate coating in the embodiment of FIG. 6 is accomplished at that position, the flexible substrate is wound up on a spool 764. A further interleaf 706 may be provided from interleaf roll 767 between the layers of the flexible substrate 140 so as to additionally avoid damage to the web.

The flexible substrate 140 may be coated with one or more thin films, i.e. one or more layers are deposited on the flexible substrate 140 by the deposition units 680. The deposition takes place while the substrate is guided on the coating drum 510. Typically at least three or even at least five deposition units may be provided that are typically arranged around the coating drum. Each deposition unit 680 may be connected to a corresponding control and/or power provision unit 690.

Embodiments described herein refer inter alia to a plasma deposition system for depositing, from a plasma phase, thin films onto a moving substrate. The flexible substrate may move in a substrate transport direction in a vacuum process chamber where a plasma deposition unit for transferring a deposition gas into a plasma phase and for depositing, from the plasma phase, a thin film onto the moving substrate is located. Consequently, also cleaning as understood herein is undertaken at the moving flexible substrate.

As shown in FIG. 6, and in accordance with embodiments described herein, one or more plasma deposition units, such as deposition unit 680, can be provided as a PECVD (plasma-enhanced chemical vapor deposition) source having a multi-region electrode device including two, three or even more RF (radio frequency) electrodes arranged opposite to the moving flexible substrate. According to embodiments, multi region plasma deposition units can also be provided for MF (middle frequency) deposition.

Generally, the one or more deposition units as described herein can be selected from the group consisting of a CVD source, a PECVD source and a PVD source. The one or more deposition units can be a sputter source, such as, a magnetron sputter source, DC sputter source, AC sputter source, pulsed sputter source, radio frequency (RF) sputtering, or middle frequency (MF) sputtering can be provided. For instance, MF sputtering with frequencies in the range of 5 kHz to 100 kHz, for example, 30 kHz to 50 kHz, can be provided. According to typical implementations, the flexible substrate coating apparatuses can be used for manufacturing flexible TFT displays, and particularly for barrier layer stacks for flexible TFT displays.

In the embodiment shown, by running over the coating drum 510, the flexible substrate passes two or more processing regions 730 that are arranged facing the deposition units 680, such as the sputter source or evaporation source, as illustrated in FIG. 6.

According to embodiments, the flexible substrate coating apparatus may include more than one coating unit, such as more than one coating drum 510. The flexible substrate 140 may be coated with one or more thin films, i.e. one or more layers are deposited on the flexible substrate by deposition units 680. The deposition takes place while the flexible substrate is guided on the coating drum 510.

Typically, the flexible substrate guide control unit as possibly provided on one or each side of the coating drum is configured for measuring and adjusting the tension of the web. Thereby, the flexible substrate transport can be better controlled, the pressure of the substrate on the coating drum can be controlled and/or damage to the substrate can be reduced or avoided.

As illustrated in the embodiment schematically shown in FIG. 6, and combinable with all other embodiments included herein, the flexible substrate coating apparatus may further be equipped with one or more seals, such as seals 290 in FIG. 6. The seals may be static seals. The seals typically allow for a pressure separation between the vacuum process chamber 60, which includes the coating drum 510 and the cleaning unit 150, and the spool chambers 70 and 80, in which flexible substrate guiding, flexible substrate winding and/or flexible substrate unwinding may be performed. Such a set-up reduces the efforts during replacing an empty flexible substrate storage spool 110 with a new flexible substrate storage spool, and likewise replacing a spool 764 after it has been completely coated. In particular, it allows keeping the vacuum process chamber 60 at medium/high vacuum conditions while having ambient pressure or low vacuum in the flexible substrate handling chamber. Notably, the one or more seals may generally be also dynamic seals, i.e., seals that can be operated during movement of the web.

In addition to the cleaning unit positioned directly downwards of the deposition units and/or the coating drum, it is possible that one or two or even further cleaning units may be provided. The several cleaning units used can be of identical type or of different type. In particular, they may each include a particle displacement and a particle dissipation unit, as will be explained in more detail below.

Figure 7:
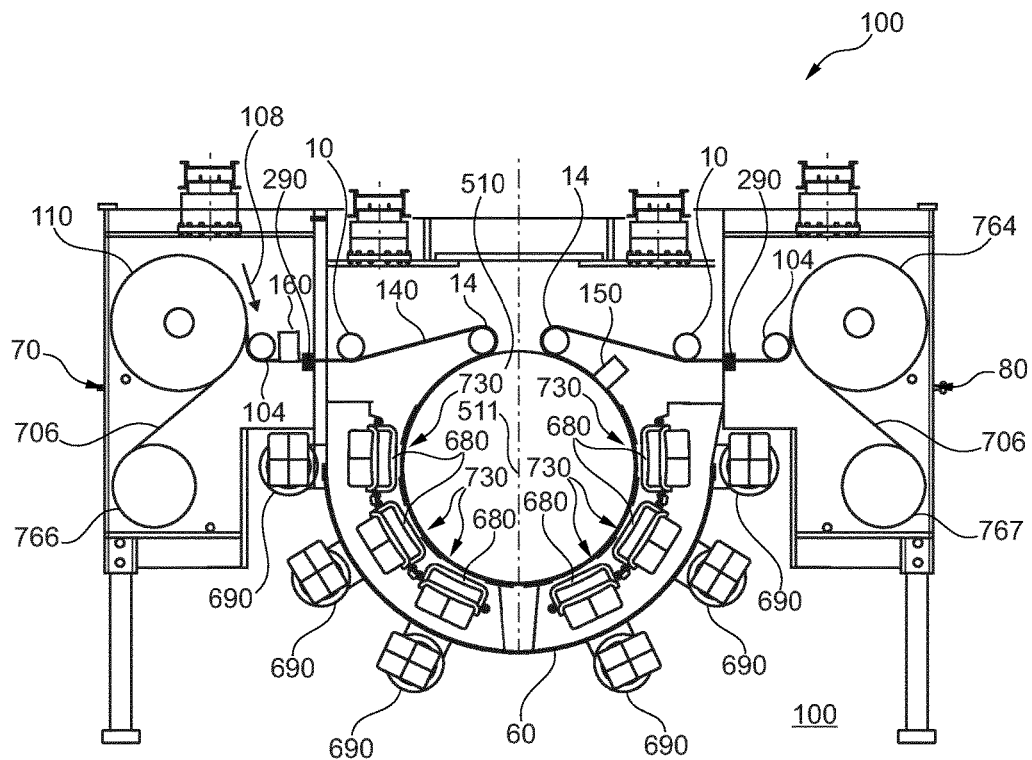

An example of an embodiment with more than one cleaning unit is illustrated in FIG. 7. In addition to the cleaning unit 150, a second cleaning unit 160 is provided downstream of the web storage spool 110, upstream of the one or more deposition units, and particularly upstream of the coating drum 510. In particular, the second cleaning unit 160 may be positioned directly downstream of the flexible substrate storage unit 110. The term "directly downstream" in this context shall particularly be understood in that the surface of the flexible substrate that is supposed to be coated shall not contact anything other than the second cleaning unit 160 after unspooling from the flexible substrate storage spool 110.

According to the embodiment illustrated in FIG. 7, the cleaning by the second cleaning unit 160 is performed on the side that is supposed to be coated only. According to other embodiments, not explicitly illustrated in FIG. 7, the second cleaning unit 160 may clean the substrate on both sides, i.e., on the side that is supposed to be coated, and on the opposite side thereof.

The embodiments illustrated in view of FIG. 7 thus provide both removing particles on the flexible substrate before the coating process and removing particles on the flexible substrate directly after the coating process, wherein particularly the particles caused during the coating process result in damage of the flexible substrate due to contact with another equipment, such as a deflection roller.

Figure 8:
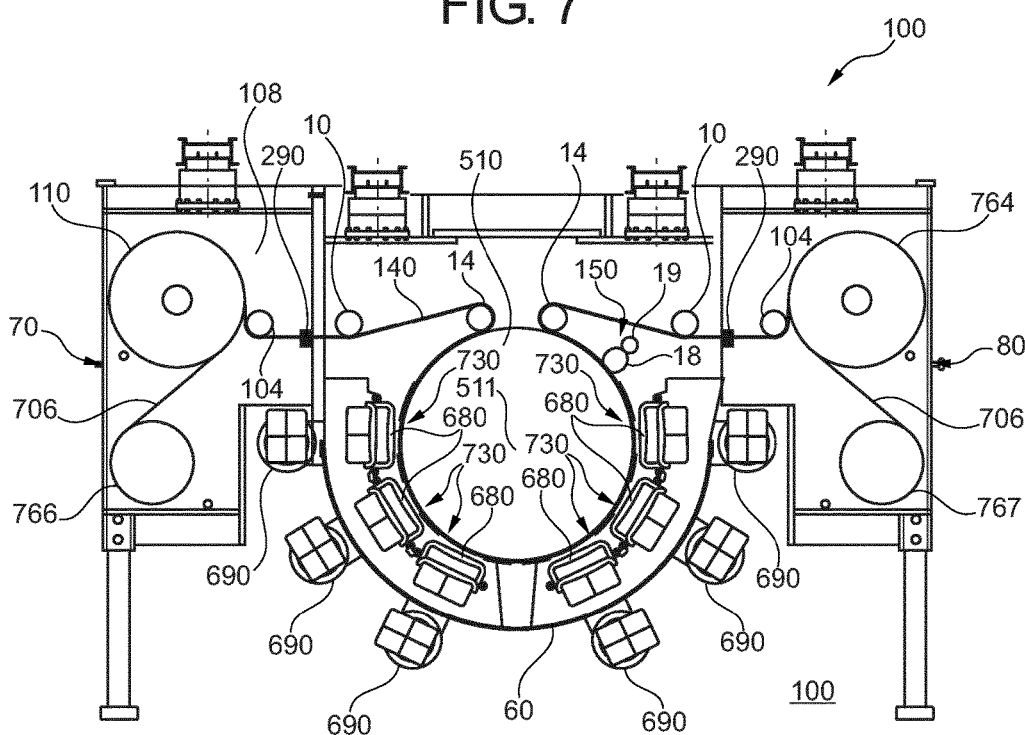

FIG. 8 is another embodiment of the present disclosure. The cleaning unit 150 positioned directly downstream of the deposition units 680 includes a particle displacement unit and a particle dissipation unit. The particle displacement unit is shown as a first roll 18 with a adhesive surface, and the particle dissipation unit is shown as a second roll 19 with a adhesive surface. Herein, the first roll with a adhesive surface shall be called first adhesive roll, and the second roll with a sticky surface shall be called second adhesive roll. In embodiments, the stickiness of the second roll 19 is larger than the stickiness of the first roll 18 (i.e., the second adhesive roll's capability to make particles adhere to it is stronger than the first adhesive roll's capability to make particles adhere to it).

The cleaning unit 150 including the first adhesive roll 18 and the second adhesive roll 19 may operate as follows. The first adhesive roll 18 is positioned to be in direct contact with the flexible substrate after the flexible substrate has been coated. The first adhesive roll 18 is typically rotating with the identical circumferential speed as the circumferential speed of the coating drum 510. The first adhesive roll 18 may be driven by the flexible substrate with which it is in contact in operation of the deposition apparatus of the embodiments described herein.

Due to the sticky surface of the first adhesive roll 18, particles on the flexible substrate are gathered by the sticky surface of the first adhesive roll. The particles thus temporarily adhere to the first adhesive roll and are rotating up, on the first adhesive roll's circumference, to the opposite side of the first adhesive roll. The second adhesive roll 19 is positioned such that it is in contact with the first adhesive roll 18. Notably, the second adhesive roll 19 is typically not in contact with the flexible substrate. Given the greater stickiness of the second adhesive roll as compared to the stickiness of the first adhesive roll, the particles on the first adhesive roll with adhere to the sticky surface of the second adhesive roll.

Thus, the particles will remain on the surface of the second adhesive roll while the outer surface of the first adhesive roll will rotate back to contact the flexible substrate again. Thereby, there will not be any particle on the first roll when it contacts the flexible substrate, and hence the contact of the first adhesive roll with the flexible substrate will not cause any damages. Instead, the particles are stored on the second adhesive roll. From time to time the second adhesive roll has to be replaced by a new one.

Figure 9:
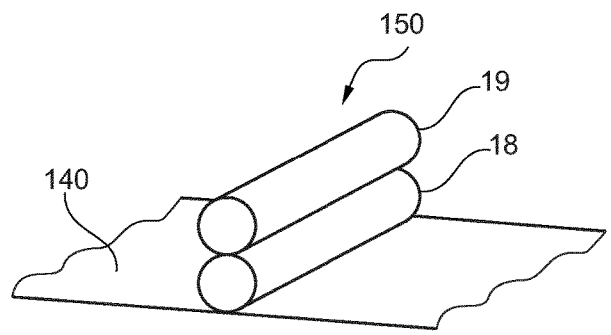
FIG. 9 shows a schematic view of a possible cleaning unit as used herein.

FIG. 9 is an illustrative excerpt showing a schematic three-dimensional view of a cleaning unit 150 including the first adhesive roll 18, acting as particle displacement unit, and the second adhesive roll 19, acting as particle dissipation unit.

As further shown in the figures, the deposition apparatus according to embodiments described herein is designed such that the deposition units 680 are provided underneath of or lateral to the coating drum 510. In particular, the entire arrangement of all deposition units or at least the arrangement of a part of the deposition units may be provided below the axis 511 of the coating drum 510. Thereby, generated particles, which could contaminate the flexible substrate and possibly jeopardize the process, remain in the deposition stations due to gravitation. Thus, the generation of undesired particles on the substrate can be reduced resulting in a reduced cleaning necessity.

Figure 10:
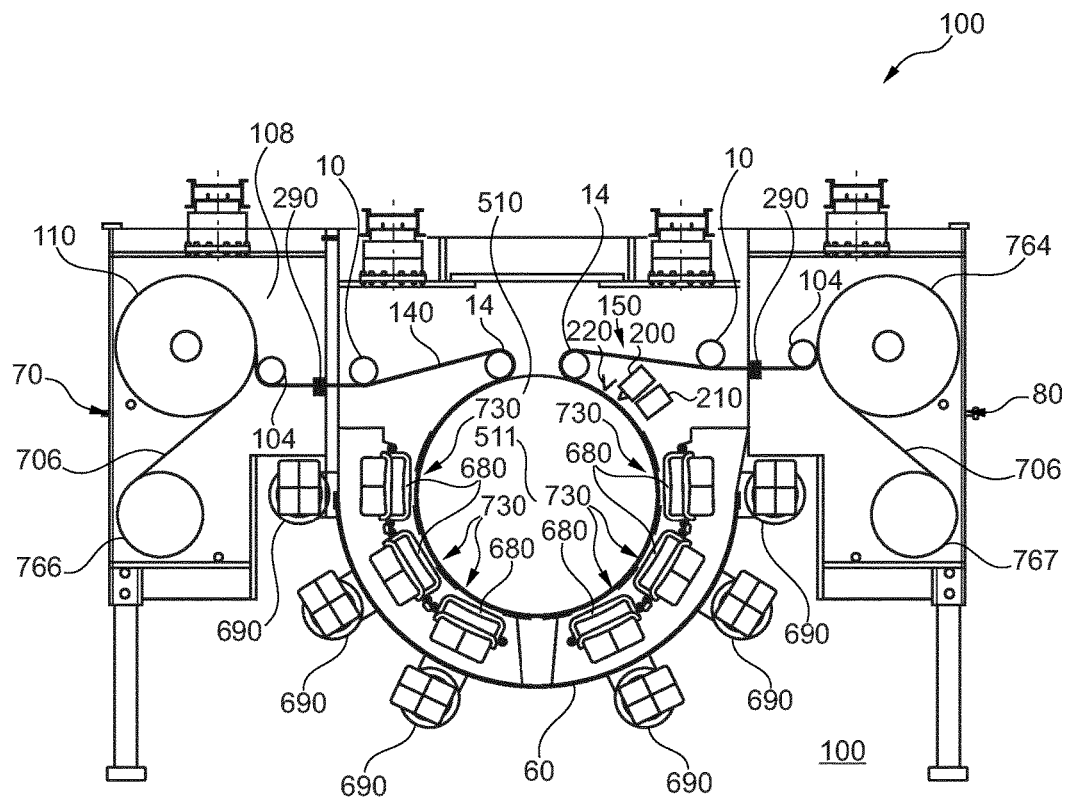
FIGS. 10 and 11 show schematic views of a flexible substrate coating apparatus according to embodiments described herein.

FIG. 10 illustrates a further embodiment of the flexible substrate coating apparatus according to the present disclosure. The cleaning unit 150 includes a laser 200. The laser beam may be expanded to cover the complete width of the flexible substrate. The expanded laser beam is typically still sufficiently energetic to separate particles from the surface of the flexible substrate. Alternatively, the laser may be controlled by an automatic particle localization system 210 that may include a camera and a controller for analyzing the taken pictures. The localization system 210 is illustratively shown in FIG. 10 and is typically positioned upstream of the cleaning unit 15. The particle localization system may localize individual particles on the substrate. The laser may direct the laser beam to the particle localized on the flexible substrate.

Generally, in embodiments, the laser beam is sufficient for separating the particle from the substrate. A further particle dissipation unit such as a suction device 220 may be provided for permanently taking the particle away from the substrate. The suction device 220 is typically positioned downstream of the laser. In embodiments, the laser is controlled and operated such that the particles are dissipated by the laser beam. In this case, a further storage device such as a suction device 220 can be dispensable.

Notably, in some embodiments, the suction device may serve as the cleaning unit and the provision of a laser and/or a particle localization unit may not be necessary. Not limited to this embodiment, it is generally possible to provide a further gas separation stage between the last deposition unit and the cleaning unit.

Figure 11:
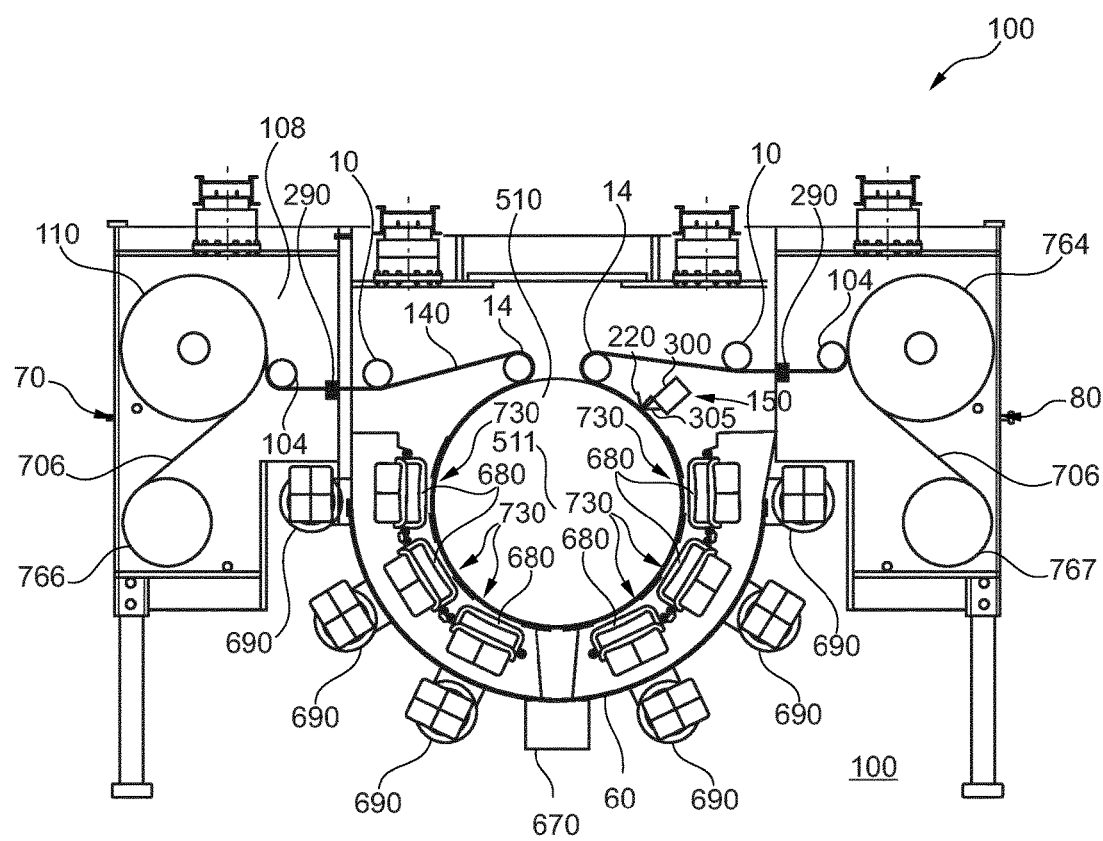

FIG. 11 illustrates another embodiment of the flexible substrate coating apparatus 100 according to the present disclosure. An ionized particle beam generated by the ionized particle beam generation unit 300 serves as the cleaning unit as described herein. The ionized particle beam may be expanded to cover the complete width of the flexible substrate. For instance, an air blade 305 or an array of nozzles may be provided as outlet. The flow of ionized particles serves to separate particles from the surface of the flexible substrate. The beam may include or consist of nitrogen.

Alternatively, the ionized particle beam may be controlled by an automatic particle localization system that may include a camera and a controller for analyzing the taken pictures. The localization system is illustratively shown in FIG. 10 and, for facility of inspection, not repeated in FIG. 11. The localization system is typically positioned upstream of the cleaning unit 150. The particle localization system may localize individual particles on the substrate. The ionized particle beam may then be directed to the particle localized on the flexible substrate.

A further particle dissipation unit such as a suction device 220 may be provided for permanently taking the particle away from the substrate. The suction device 220 is typically positioned downstream of the ionized particle beam generation unit. The suction device 220 as described herein may have an air-knife as inlet. Alternatively, it may have a multitude of nozzles. Notably, in some embodiments, the suction device itself may serve as cleaning unit and the provision of an ionized particle beam generation unit and/or a particle localization unit is not necessary. Generally, and not limited to any embodiment, the suction unit may be an electrostatic charged device acting as a particle trap.

In still other embodiments, a suction device 220 is dispensable. Instead, the additional ionized particle beam is cleared from the vacuum process chambers by the one or more vacuum pumps 670 that are located at the vacuum process chamber 60 and operated during the deposition process anyway (for ease of illustration the vacuum pumps are not explicitly shown in the other figures although the respective embodiments may include vacuum pumps). Thus, in this case, a further storage device such as a suction device 220 can be dispensable.

As already described above, the apparatuses and methods according to embodiments described herein can include a plurality of optional features, aspects and details, which might be implemented alternatively or in combination. For example, the methods can include providing an interleaf between layers of substrate on a roll or receiving an interleaf at the unwinding side.

Due to the high temperatures during coating, and due to the positioning of the cleaning unit close to the deposition process, the cleaning unit according to the present disclosure may be configured to withstand temperatures of at least 50° C., 70° C., or even 100° C. The flexible substrate temperature or the temperature of the coating drum can be from 20° C. to 250° C. or even up to 400° C. Typically, the substrate thickness can be between 50 μm to 125 μm.

Generally, in coating procedures that may include highly exothermic reactions, it may be desirable to cool the coating drum of a flexible substrate deposition apparatus. This is particularly true as it may be desirable to avoid high temperatures of the flexible substrate when it is cleaned. The reason may be that a heating of the cleaning unit may result in an increased evaporation of unknown or undesired gases from the cleaning unit (e.g., in the case of roll with sticky surface). Also, other cleaning processes may generate heat by themselves, and any additional heating is undesired (such as in the case of a particle separation with a laser).

The coating drum as disclosed herein may thus include a cooling unit (not shown in the figures), for instance, a cooling unit configured to cool down the coating drum to −15° C.

Alternatively or additionally, the cleaning unit may include a cooling unit (not shown in the figures). Thereby, the cleaning unit can be held at temperatures that allow keeping the evaporation of unknown or undesired gases from the cleaning unit at an acceptable level. Such a cooling of the cleaning unit is particularly beneficial where the desired deposition process requires high temperatures and the coating drum is possibly heated to temperatures of, for instance, up to 300° C. Notably, the heating of the coating drum may not only be caused by the deposition process but also by a heating unit provided in the coating unit (not shown).

As mentioned previously, the one or more deposition units can include one or more plasma enhanced chemical vapor deposition (PECVD) sources. The plasma enhanced deposition units can be operated at a frequency of 2 MHz to 90 MHz (RF frequence), for example a frequency of 40.68 MHz, and an integrated impedance sensor can provide for real time in-line process monitoring and control of respective process parameters, for example, the distance of the electrode of the deposition unit from the substrate.

In all the embodiments described herein, one or more vacuum pumps may be provided such as the vacuum pumps 670 in FIG. 11. They can be activated to evacuate the vacuum process chamber 60 for producing high or medium vacuum for the deposition. Furthermore, they may be used to draw off the processing gases, e.g. highly reactive processing gases, from the vacuum process chamber during deposition. Furthermore, as described, they may also be used to draw off the cleaning gas, such as the ionized particle beam of the ionized particle beam generator.

In embodiments, typically after one or several coating processes, one or more purging gases may be introduced into the processing chamber such as Argon and Nitrogen to facilitate the purge process. This helps reducing the generation of particles on the flexible substrate and may thus be additionally beneficial. The purge gases may then be pumped out of the processing chamber. The vacuum pumps as disclosed herein usually create medium to high vacuums inside of the processing chamber. For example, the vacuum inside of the processing chamber may be anywhere from 10−1 mbar to 10−7 mbar, in particular, from 10−2 mbar to 10−6 mbar such as 10−3 mbar.

According to some embodiments, some process residues, such as gases or solid materials, might need to be removed before a cleaning step in order to avoid unwanted chemical reactions. This is typically done with a pump-and-purge process. According to some embodiments, the pump and purge processes as described herein can include a plurality of cycles, e.g. at least two or at least 3 cycles of pump down to around 10−2 mbar or below and a purge with an inert gas, e.g. Ar or N2, up to a pressure of around 10 mbar to 20 mbar. However, for some embodiments pumping only or purging only might be sufficient to prepare the deposition apparatus for cleaning.

After one or more depositions, it is also possible according to embodiments described herein that a plasma cleaning (e.g. plasma etching) procedure may be initiated which may remove impurities and contaminants from the surfaces within the vacuum process chamber. Typically, the plasma cleaning procedure is initiated after the first pump and/or purge procedure. The plasma cleaning may be initiated by applying RF voltages, which partially and/or fully ionize, for instance, a fluorinated gas introduced into the processing chamber. In embodiments described herein, the processing chamber is kept at low pressures during the plasma cleaning procedure. For instance, the processing chamber is maintained at pressure anywhere from $1 \times 10^{-1}$ mbar to $1 \times 10^{-4}$ mbar, such as at $10^{-2}$ mbar.

Typically, the intensity of RF energy may be adjustable in order to control, for instance, the rate of contaminant removal inside of the processing chamber. In general, sufficient RF energy may be applied to produce a high plasma density, which may ensure a high rate of contaminant removal. Moreover, high plasma densities may avoid that underlying layers of contaminants cross-link in three-dimensions thereby creating stable but un-removed new structures.

Thus, in embodiments described herein, sensors and controllers may be employed to monitor and adjust the plasma density.

According to embodiments described herein, during the plasma cleaning procedure, the coating drum may typically stand still. A sacrificial foil may be used to cover the coating drum thereby protecting the surface of the coating drum from the cleaning plasma. As opposed to flexible substrates that may react with the cleaning plasma and be damaged thereby, the sacrificial foil according to embodiments described herein may be inert with respect to the cleaning plasma and thus re-used in other cleaning procedures. Further, the risk of damaging the substrate because the drum is exposed to the cleaning plasma through damaged portions of the substrate is reduced or avoided.

While the foregoing is directed to embodiments of the invention, other and further embodiments of the invention may be devised without departing from the basic scope thereof, and the scope thereof is determined by the claims that follow.

The invention claimed is:

1. A flexible substrate coating apparatus, comprising,
a vacuum process chamber for processing a flexible substrate, the vacuum process chamber including one or more deposition units;
a coating drum having an axis of rotation; and
a cleaning unit positioned directly downstream of the one or more deposition units, wherein the cleaning unit is positioned such that it contacts the flexible substrate at a position where the flexible substrate is in contact with the coating drum.

2. The flexible substrate coating apparatus according to claim 1, wherein the cleaning unit includes a particle displacement unit and a particle dissipation unit.

3. The flexible substrate coating apparatus according to claim 1, further including one or more deflection rolls that are positioned downstream of the one or more deposition units, wherein all of the one or more deflection rolls that contact the flexible substrate on a coated side of the flexible substrate and positioned downstream of the one or more deposition units are positioned downstream of the cleaning unit.

4. The flexible substrate coating apparatus according to claim 1, wherein the cleaning unit includes a first adhesive roll and a second adhesive roll.

5. The flexible substrate coating apparatus according to claim 4, wherein the first adhesive roll is positioned so as to contact the flexible substrate in operation of the flexible substrate deposition apparatus, and the second adhesive roll is positioned such that the surface of the second adhesive roll is in contact with the surface of the first adhesive roll.

6. The flexible substrate coating apparatus according to claim 1, wherein all of the one or more deposition units are positioned below the axis of rotation of the coating drum.

7. The flexible substrate coating apparatus according to claim 1, further comprising one or more of a cooling unit for cooling the coating drum, a cooling unit for cooling the cleaning unit, and a heating unit for heating the coating drum.

8. The flexible substrate coating apparatus according to claim 1, further including one or more spool chambers for receiving a flexible substrate spool, wherein the pressure in the one or more spool chambers is higher than in the vacuum process chamber.

9. The flexible substrate coating apparatus according to claim 1, wherein the cleaning unit includes a laser.

10. The flexible substrate coating apparatus according to claim 4, wherein the second adhesive roll has stronger adherence of particles thereto than the first adhesive roll.

11. The flexible substrate deposition apparatus according to claim 5, wherein the second adhesive roll is positioned such that it is not in contact with the flexible substrate during operation of the flexible substrate deposition apparatus.

12. The flexible substrate coating apparatus according to claim 1, wherein at least half of the one or more deposition units are positioned below the axis of rotation of the coating drum.

13. The flexible substrate coating apparatus according to claim 8, wherein the one or more spool chambers are positioned adjacent to the vacuum process chamber.

14. The flexible substrate coating apparatus of claim 1, wherein the cleaning unit includes a suction unit.

\* \* \* \* \*